(12) United States Patent
Peluso et al.

(10) Patent No.: US 12,575,023 B2
(45) Date of Patent: **\*Mar. 10, 2026**

(54) VOLTAGE REGULATOR MODULE HAVING A POWER STAGE

(71) Applicant: Infineon Technologies Austria AG, Villach (AT)

(72) Inventors: Luca Peluso, Villach (AT); Kushal Kshirsagar, Fremont, CA (US); Paul Yeaman, Pleham, NH (US); Anil Jeswani, Acton, MA (US); Marco Pennetti, Esslingen a.N. (DE); Kok Yau Chua, Melaka (MY)

(73) Assignees: Infineon Technologies Austria AG, Villach (AT); Infineon Technologies Americas Corp., El Segundo, CA (US)

( \* ) Notice: Subject to any disclaimer, the term of this patent is extended or adjusted under 35 U.S.C. 154(b) by 431 days.

This patent is subject to a terminal disclaimer.

(21) Appl. No.: 18/122,891

(22) Filed: Mar. 17, 2023

(65) Prior Publication Data

US 2024/0314926 A1      Sep. 19, 2024

(51) Int. Cl.
| *H05K 1/02* | (2006.01) |
| *H01L 23/50* | (2006.01) |
(Continued)

(52) U.S. Cl.
CPC ........... *H05K 1/0262* (2013.01); *H01L 23/50* (2013.01); *H05K 1/0201* (2013.01); *H05K 1/111* (2013.01);
(Continued)

(58) Field of Classification Search
CPC ..................................................... H05K 1/0262
(Continued)

(56) References Cited

U.S. PATENT DOCUMENTS

| 5,867,367 A | 2/1999 | Barrow |
| 6,160,223 A | 12/2000 | Gates |
(Continued)

FOREIGN PATENT DOCUMENTS

| EP | 1942574 A1 | 7/2008 |
| JP | 2010045111 A | 2/2010 |

OTHER PUBLICATIONS

Deboy, Gerald, et al., "Voltage Regulator Module With Inductor-Cooled Power Stage", U.S. Appl. No. 17/742,442, filed May 12, 2022, 1-35.

*Primary Examiner* — Stanley Tso
(74) *Attorney, Agent, or Firm* — Murphy, Bilak & Homiller, PLLC

(57) ABSTRACT

A voltage regulator module includes: a substrate having power input and output terminals; a power stage package mounted to the substrate and having first and second pads at a side facing away from the substrate, the power stage package configured to receive an input voltage from the power input terminal and output a phase current at the first pad; an inductor having a vertical conductor embedded in a magnetic core, the vertical conductor having a first end attached to the first pad of the power stage package and an opposite second end; and a metallic clip attached to each of the second end of the vertical conductor, the power output terminal, and the second pad of the power stage package. The second pad of the power stage package does not carry any of the phase current.

19 Claims, 9 Drawing Sheets

(51) Int. Cl.

| | |
|---|---|
| H05K 1/11 | (2006.01) |
| H05K 1/181 | (2026.01) |

(52) U.S. Cl.
CPC ..... *H05K 1/181* (2013.01); *H05K 2201/1003* (2013.01); *H05K 2201/10053* (2013.01); *H05K 2201/10227* (2013.01)

(58) Field of Classification Search
USPC ........................................................ 361/760
See application file for complete search history.

(56) References Cited

U.S. PATENT DOCUMENTS

| | | |
|---|---|---|
| 2003/0141600 A1 | 7/2003 | Van |
| 2007/0075815 A1 | 4/2007 | Lotfi et al. |
| 2008/0272483 A1 | 11/2008 | Oman |
| 2010/0085139 A1 | 4/2010 | Yan et al. |
| 2011/0053319 A1 | 3/2011 | Hohlfeld et al. |
| 2016/0095225 A1* | 3/2016 | Fazelpour ......... H01L 23/49838 |
| | | 29/841 |
| 2016/0381823 A1* | 12/2016 | Ye .......................... H05K 1/182 |
| | | 361/736 |
| 2017/0148705 A1 | 5/2017 | Cho |
| 2018/0054119 A1 | 2/2018 | Cho et al. |
| 2018/0182532 A1 | 6/2018 | Stahr et al. |
| 2018/0190573 A1 | 7/2018 | Mullenix et al. |
| 2018/0270957 A1 | 9/2018 | Swaminathan et al. |
| 2019/0324223 A1 | 10/2019 | Yim et al. |
| 2020/0161274 A1 | 5/2020 | Lee |
| 2020/0245465 A1 | 7/2020 | Zhang et al. |
| 2021/0105898 A1 | 4/2021 | Chiang et al. |
| 2021/0307173 A1 | 9/2021 | Lenhardt et al. |
| 2022/0007502 A1* | 1/2022 | Chiang ................ H05K 1/0209 |
| 2022/0093573 A1 | 3/2022 | Kessler et al. |
| 2024/0072739 A1 | 2/2024 | Kim et al. |
| 2024/0186206 A1* | 6/2024 | Prathaban ............ H05K 1/0262 |

* cited by examiner

VOLTAGE REGULATOR MODULE HAVING A POWER STAGE

BACKGROUND

Modern voltage regulator modules are used in many types of high power applications such as AI (artificial intelligence) training processors, cloud-based based data centers, etc. and which require low thermal resistance (Rth). Conventional inductor-cooled power stage modules have a thermal resistance down to 5.2K/W. However, some high power applications require even lower thermal resistance.

Thus, there is a need for a voltage regulator module design with a thermal resistance below 5.2K/W.

SUMMARY

According to an embodiment of a voltage regulator module, the voltage regulator module comprises: a substrate having a power input terminal and a power output terminal; a power stage package mounted to the substrate and having a first pad and a second pad at a side that faces away from the substrate, the power stage package configured to receive an input voltage from the power input terminal and output a phase current at the first pad; an inductor having a vertical conductor embedded in a magnetic core, the vertical conductor having a first end attached to the first pad of the power stage package and a second end opposite the first end; and a metallic clip attached to each of the second end of the vertical conductor, the power output terminal of the substrate, and the second pad of the power stage package, wherein the second pad of the power stage package does not carry any of the phase current.

According to another embodiment of a voltage regulator module, the voltage regulator module comprises: a substrate having a power input terminal and a power output terminal; a power stage package mounted to the substrate and having a first pad and a second pad at a side that faces away from the substrate, the power stage package configured to receive an input voltage from the power input terminal and output a phase current at the first pad; a discrete inductor electrically connecting the first pad of the power stage package to the power output terminal of the substrate; and a metallic body in thermal contact with the second pad of the power stage package, wherein the second pad of the power stage package does not carry any of the phase current.

According to an embodiment of a method of producing a voltage regulator module, the method comprises: mounting a power stage package to a substrate, the substrate having a power input terminal and a power output terminal, the power stage package having a first pad and a second pad at a side that faces away from the substrate, the power stage package configured to receive an input voltage from the power input terminal and output a phase current at the first pad; attaching a first end of a vertical conductor of an inductor to the first pad of the power stage package, the vertical conductor being embedded in a magnetic core and having a second end opposite the first end; and attaching a metallic clip to each of the second end of the vertical conductor, the power output terminal of the substrate, and the second pad of the power stage package, wherein the second pad of the power stage package does not carry any of the phase current.

According to another embodiment of a method of producing a voltage regulator module, the method comprises: mounting a power stage package to a substrate, the substrate having a power input terminal and a power output terminal, the power stage package having a first pad and a second pad at a side that faces away from the substrate, the power stage package configured to receive an input voltage from the power input terminal and output a phase current at the first pad; electrically connecting the first pad of the power stage package to the power output terminal of the substrate via a discrete inductor; and thermally contacting the second pad of the power stage package with a metallic body, wherein the second pad of the power stage package does not carry any of the phase current.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide voltage regulator module designs with a thermal resistance below 5.2K/W. A power stage package included in the voltage regulator module has first and second pads at a side of the package that faces away from a substrate of the module and to which the power stage package is mounted. The first pad of the power stage package outputs a phase current of the voltage regulator module. The second pad of the power stage package but does not carry any of the phase current. An inductor electrically connects the first pad of the power stage package that carries the phase current to a power output terminal of the voltage regulator module. Depending on the type of inductor used, the inductor may form part of a thermal path for removing heat dissipated by the power stage package. A metallic clip or metallic body is in thermal contact with the second pad of the power stage package that does not carry any of the phase current, to lower the thermal resistance of the voltage regulator module.

Described next, with reference to the figures, are exemplary embodiments of the voltage regulator module, methods of producing the voltage regulator module, and electronic assemblies that includes the voltage regulator module.

Figures 1A, 1B:
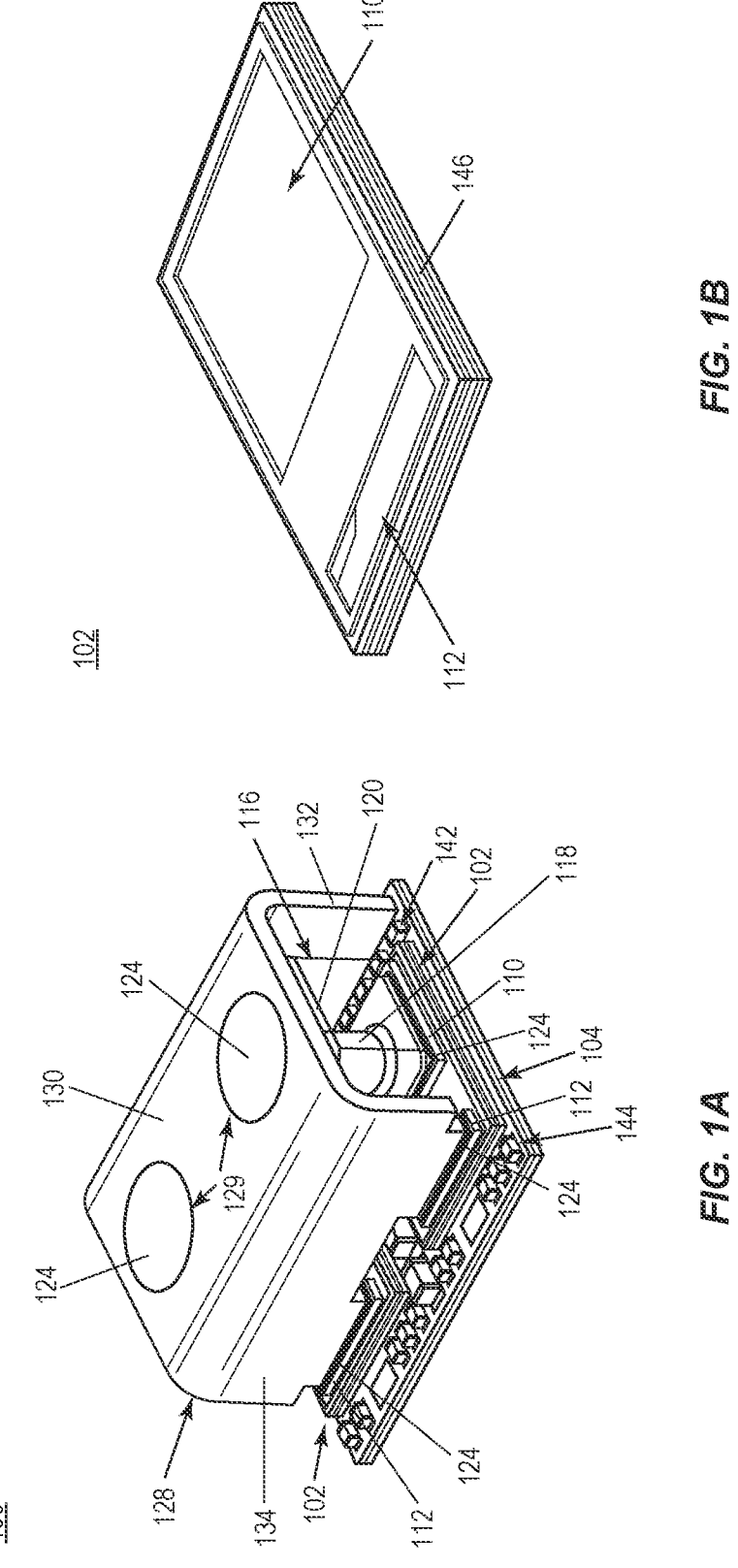
FIG. 1A illustrates a top perspective view of an inductor-cooled voltage regulator module having an additional thermal path to the topside of the module.
FIG. 1B illustrates a top perspective view of a power stage package included in the inductor-cooled voltage regulator module.
Figure 1C:
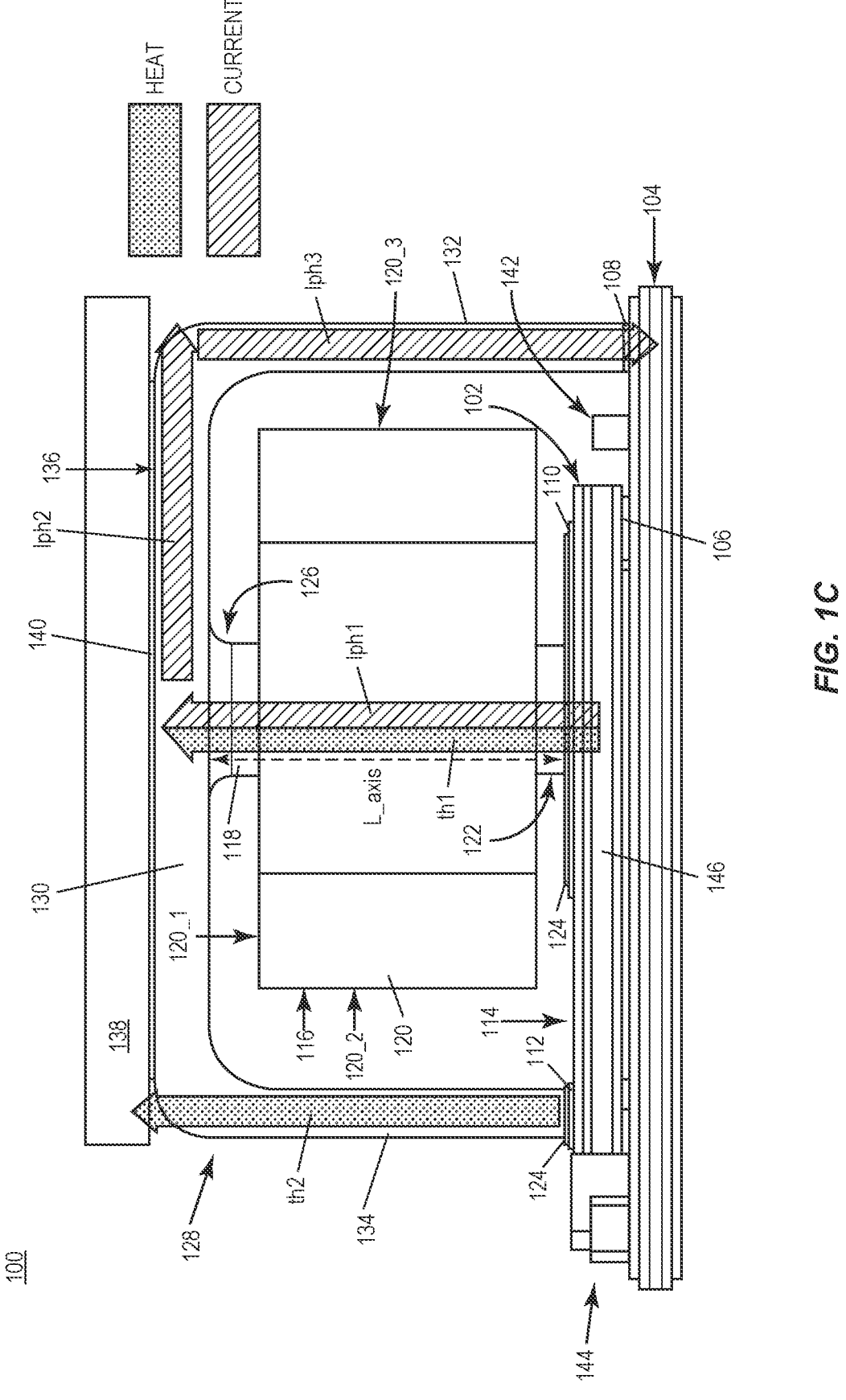
FIG. 1C illustrates a side view of the inductor-cooled voltage regulator module, with both current flow and heat flow superposition.

FIGS. 1A through 1C illustrate an embodiment of an inductor-cooled voltage regulator module 100. FIG. 1A illustrates a top perspective view of the inductor-cooled voltage regulator module 100. FIG. 1B illustrates a top perspective view of a power stage package 102 included in the inductor-cooled voltage regulator module 100. FIG. 1C illustrates a side view of the inductor-cooled voltage regulator module 100, with both current flow and heat flow superposition.

A substrate 104 of the inductor-cooled voltage regulator module 100 has a power input terminal 106 and a power output terminal 108. The power input terminal 106 and the power output terminal 108 may be at the same side of the substrate 104. The power stage package 102 is mounted to the substrate 104 and has a first pad 110 and a second pad 112 at a side 114 of the power stage package 102 that faces away from the substrate 104. The power stage package 102 receives an input voltage (VIN) from the power input terminal 106 and outputs a phase current (Iph) at the first pad 110.

The inductor-cooled voltage regulator module 100 also includes an inductor 116 that has a vertical conductor 118 embedded in a magnetic core 120. Only an outline of the magnetic core 120 is shown in FIG. 1A, to provide a more complete view of the vertical conductor 118. The vertical conductor 118 has a first end 122 attached to the first pad 110 of the power stage package 102, e.g., by a fixing material 124 such as solder, an electrically conductive adhesive, etc. and a second end 126 opposite the first end 122.

The inductor-cooled voltage regulator module 100 further includes a metallic clip 128 attached to each of the second end 126 of the vertical conductor 118, the power output terminal 108 of the substrate 104, and the second pad 112 of the power stage package 102. The metallic clip 128 and the vertical conductor 118 of the inductor 116 may comprise Cu (copper) or any other metal or metal alloy that has high values of thermal conductivity and electrical conduction for good thermal and electrical performance. The second pad 112 of the power stage package 102 does not carry any of the phase current. The second pad 112 of the power stage package 102 may be at an output voltage potential (VOUT) of the inductor-cooled voltage regulator module 100. For example, in the case of a discrete copper block that is not connected to the metallic clip 128 but is still connected to the same heatsink as the metallic clip 128 through an electrically isolating thermal interface material, the second pad 112 provides improved thermal performance but is not at Vout potential.

The inductor-cooled voltage regulator module 100 shown in FIGS. 1A through 1C may be produced by mounting the power stage package 102 to the module substrate 104, attaching the first end 122 of the vertical conductor 118 of the module inductor 116 to the first pad 110 of the power stage package 102, e.g., by soldering, gluing, etc., and attaching the metallic clip 128 to each of the second end 126 of the vertical conductor 118, the power output terminal 108 of the module substrate 102, and the second pad 112 of the power stage package 102.

In FIGS. 1A through 1C, the second pad 112 of the power stage package 102 is at the output voltage potential VOUT of the inductor-cooled voltage regulator module 100 because the metallic clip 128 includes a first part 130 attached to the second end 126 of the vertical conductor 118 of the inductor 116, e.g., by laser welding, by a fixing material 124 such as solder, an electrically conductive adhesive, etc., a second part 132 that electrically connects the power output terminal 108 of the substrate 104 to the first part 130 of the metallic clip 128, and a third part 134 that thermally connects the second pad 112 of the power stage package 102 to the first part 130 of the metallic clip 128, e.g., by a fixing material 124 such as solder, an electrically conductive adhesive, etc. According to this embodiment, the second part 132 of the metallic clip 128 touches down on the module substrate 104 and the third part 134 of the metallic clip 128 touches down on the power stage package 102. The first, second, and third parts 130, 132, 134 of the metallic clip 128 may be formed as a single contiguous unit, e.g., by stamping, bending, etc.

The metallic clip 128 may have a U-shape and cover the top side 120_1 of the magnetic core 120 that faces away from the power stage package 102, a first side face 120_2 of the magnetic core 120, and a second side face 120_3 of the magnetic core 120 opposite the first side face 120_2. The vertical conductor 118 of the inductor 116 may have a cylindrical or cuboidal shape with a longitudinal axis 'L_axis' that extends between the first pad 110 of the power stage package 102 and the first part 130 of the metallic clip 128. The first part 130 of the metallic clip 128 may have an opening 129 sized and shaped to receive the second end 126 of the vertical conductor 118. The second end 126 of the vertical conductor 118 may be secured in the opening 129 in the metallic clip 128 by laser welding, by a fixing material 124 such as solder, an electrically conductive adhesive, etc. The vertical conductor 118 carries the phase current from the first pad 110 of the power stage package 102 to the first part 130 of the metallic clip 128, thereby providing both cooling and a low-ohmic current path with minimum parasitic inductance.

The phase current path includes an upward vertical component Iph1, a lateral component Iph2, and a downward vertical component Iph3. The upward vertical component Iph1 of the phase current is through the vertical conductor 118 of the inductor 116 along the longitudinal inductor axis L_axis which is at an angle of approximately 90° (degrees) relative to the top side 114 of the power stage package 102. The lateral component Iph2 of the phase current is through the first part 130 of the metallic clip 128 and the second part 132 of the metallic clip 128. The downward vertical component Iph3 of the phase current is through the second part 132 of the metallic clip 128.

The second pad 112 of the power stage package 102 does not form part of the phase current path of the power stage package 102. Instead, the phase current is output at the first pad 110 of the power stage package 102. Accordingly, none of the phase current traverses the third part 134 of the metallic clip 128 but the third part 134 of the metallic clip 128 does provide an additional thermal path 'th2' that is in parallel with the thermal path 'th1' provided by the vertical conductor 118 of the inductor 116. Simulations show a thermal resistance (Rth) of 2.6K/W from the junction of a gate driver 300 (cf FIG. 3) to the top side 136 of the metallic clip 128.

A heat sink 138 may be in thermal contact with the metallic clip 128 at the top side 136 of the metallic clip 128, e.g., as shown in FIG. 1C. The heat sink 138 may be electrically isolated from the metallic clip 128 by a thermal interface material 140 that is electrically insulative such as a silicone-based or synthetic-based thermal compound or grease. The heat sink 138 may be air or liquid cooled. The vertical conductor 118 of the inductor 116 and the first part 130 of the metallic clip 128 provide a first thermal path 'th1' from the power stage package 102 to the heat sink 138. The third part 134 and the first part 130 of the metallic clip 128 provide a second thermal path 'th2' from the power stage package 102 to the heat sink 138. The first and second thermal paths 'th1', 'th2' are in parallel in FIGS. 1A through 1C.

As shown in FIG. 1A, the inductor-cooled voltage regulator module 100 may have more than one power stage package 102 and inductor 116. In the illustrated example, the inductor-cooled voltage regulator module 100 has two synchronous buck converter circuits and two single phase inductors 116. Both power stage packages 102 receive the same input voltage VIN. In FIG. 1A, the metallic clip 128 coalesces the output phase currents of both power stage packages 102 and feeds the summed current back to the module interface which includes the power input and output terminals 110, 112. The current path of the metallic clip 128 is located outside the magnetic core material and therefore produces no magnetic flux in this example.

The substrate 104 of the inductor-cooled voltage regulator module 100 may include one or more output capacitors 142 in close proximity to the contact point between the second part 132 of the metallic clip 128 and the output terminal 108. The module substrate 104 may also include one or more input capacitors 144, etc.

The semiconductor devices (out of view in FIGS. 1A through 1C) that produce the phase current at the first pad 110 of the power stage package 102 may be embedded in a circuit board 146 such as a multi-layer PCB (printed circuit board) with the exposed first and second pads 110, 112 formed in an upper metal layer of the circuit board 146. The metallic clip 128 may cover the power stage package 102 and form an electromagnetic shield for the inductor 116 and the semiconductor devices of the power stage package 102. For example, the metallic clip 128 may be configured as a Faraday cage for potentially disturbing electro-magnetic emissions, e.g., from switching of the semiconductor devices included in the power stage package 102.

Internal electrical connections between the embedded semiconductor devices may be implemented by one or more additional metal layers and electrically conductive vias of the circuit board 146. The second pad 112 of the power stage package 102 may be implemented as a single island 144, e.g., as shown in FIG. 1B.

Figure 2:
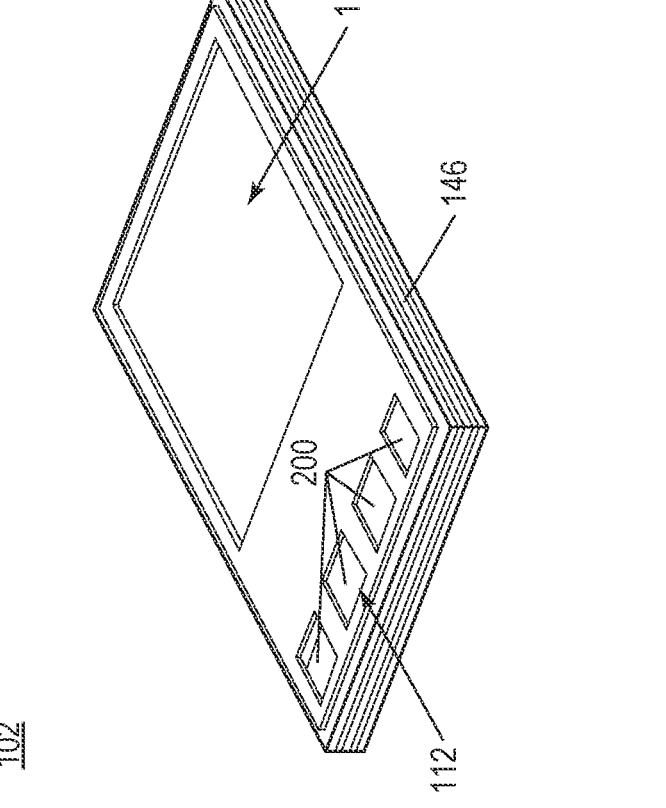
FIG. 2 illustrates a top perspective view of the power stage package, according to another embodiment.

FIG. 2 illustrates a top perspective view of the power stage package 102, according to another embodiment. In FIG. 2, the second pad 112 of the power stage package 102 is segmented into a plurality of spaced apart segments 200. In each of FIGS. 1A through 1C and FIG. 2, the second pad 112 of the power stage package 102 is at the output voltage potential VOUT of the inductor-cooled voltage regulator module 100 but does not carry any of the phase current because the second pad 112 does not form part of the phase current path. In one embodiment, the second pad 112 of the power stage package 102 is contacted only by the third part 134 of the metallic clip 128, e.g., as shown in FIGS. 1A and 1C.

Figure 3:
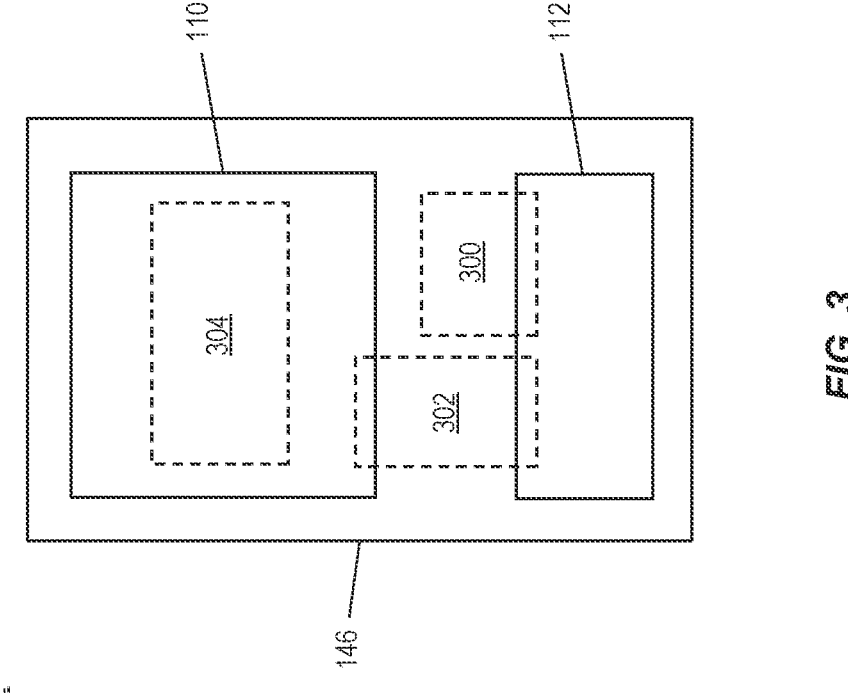
FIG. 3 illustrates a schematic diagram of an embodiment of the semiconductor devices embedded in a circuit board of the power stage package.

FIG. 3 illustrates a schematic diagram of an embodiment of the semiconductor devices embedded in the circuit board 146 of the power stage package 102. According to this embodiment, a gate driver die 300, a first power switch die 302, and a second power switch die 304 are each embedded in the circuit board 146 of the power stage package 102 and thus illustrated in FIG. 3 using dashed rectangles. The first power switch die 302 and the second power switch die 304 are electrically connected in series to deliver the phase current at the first pad 110 of the power stage package 102. The gate driver die 300 drives both the first power switch die 302 and the second power switch die 304.

Additional elements such as a controller, voltage and/or current sense elements, etc. may be attached to or embedded in the circuit board 146 of the power stage package 102. In one configuration, the first power switch die 302 and the second power switch die 304 are connected in a half-bridge configuration to the first pad 110 of the power stage package 102, where the first power switch die 302 implements a high-side switch that acts as a control switch and the second power switch die 304 implements a low-side switch that acts as a synchronous rectification switch. The circuit may form a synchronous buck converter receiving an input voltage and being coupled to the inductor 116 at the first pad 110 of the power stage package 102.

The first power switch die 302 and the second power switch die 304 of the power stage package 102 are cooled through the vertical conductor 118 of the inductor 116 and the first part 130 of the metallic clip 128 towards the heat sink 138. The third part 134 of the metallic clip 128 provides a second, parallel thermal heat flow path between the power stage package 102 and the heat sink 138.

In one embodiment, the first power switch die 302 of the power stage package 102 may include a high-side Si or SiC power MOSFET (metal-oxide-semiconductor field-effect transistor) having a drain terminal electrically connected to the power input terminal 106 of the inductor-cooled voltage regulator module 100 and a source terminal electrically connected to the first pad 110 of the power stage package 102. The second power switch die 304 of the power stage package 102 may include a low-side Si or SiC power MOSFET having a drain terminal electrically connected to the first pad 110 of the power stage package 102 and a source terminal electrically connected to a ground terminal of the inductor-cooled voltage regulator module 100. The circuit board 146 of the power stage package 102 may include a metal conductor that electrically connects the source terminal of the high-side power MOSFET and the drain terminal of the low-side power MOSFET to the first end 122 of the inductor 116 in a half-bridge configuration. The gate terminals of the high-side and low-side power MOSFETs are controlled by the gate driver die 300.

In the case of vertical power MOSFET devices, the source terminals and drain terminals of each device are disposed at opposite sides of the dies 302, 304. The drain terminal of the high-side power MOSFET and the source terminal of the low-side power MOSFET may face away from the inductor 116 whereas the source terminal of the high-side power MOSFET and the drain terminal of the low-side power MOSFET may face towards the inductor 116 to minimize current redistribution and avoid parasitic inductance.

In the case of lateral power devices such as GaN HEMTs (high-electron mobility transistors), the source terminals and drain terminals of each power switch die 302, 304 are disposed at the same side of the dies 302, 304. Other types of power transistor dies such as IGBTs (insulated-gate bipolar transistors) may be used instead. In each case, the circuit board 146 of the power stage package 102 of the inductor-cooled voltage regulator module 100 may include patterned metallization layers and interconnecting vias designed to accommodate electrical connections to either vertical or lateral power switch dies 302, 304.

Figure 4:
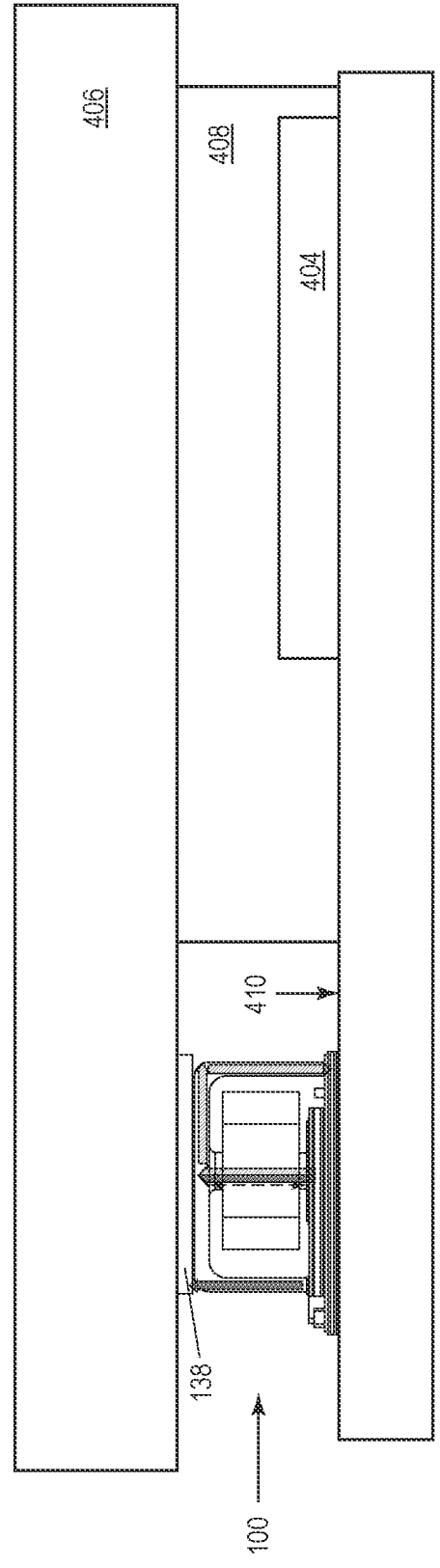
FIG. 4 illustrates a side perspective view of an embodiment of an electronic assembly that includes the inductor-cooled voltage regulator module.

FIG. 4 illustrates a side perspective view of an embodiment of an electronic assembly 400 that includes the inductor-cooled voltage regulator module 100. The electronic assembly 400 also includes a system circuit board 402 and a processor 404 mounted to the system circuit board 402. The inductor-cooled voltage regulator module 100 also is mounted to the system circuit board 402. The system circuit board 402 may be a multi-layer PCB having one or more patterned metallization layers and interconnecting vias. For example, the system circuit board 402 may be a motherboard or an accelerator card of an electronic assembly with multiple processors, or an interposer such as a molded interconnect substrate that attaches to such a system board.

The inductor-cooled voltage regulator module 100 provides power to one or more processors 404 mounted to the system circuit board 402. More than one voltage regulator module 100 may be mounted to the system circuit board 402, depending on the number of processors 404 mounted to the system circuit board 402. The electronic assembly 400 may also include a heat sink 406 such as an air or liquid cooled heat sink in thermal contact with both the metallic clip 128 of the inductor-cooled voltage regulator module 100 and a socket or interposer 408 that mounts each processor 404 to the system circuit board 402.

The inductor-cooled voltage regulator module 100 is in close proximity to the processor 404, minimizing resistive losses caused by high current flow through the power delivery network. Since minimizing resistive losses requires adding a metal such as copper to the power delivery network and copper has high thermal conductivity, the board surface 410 on which the inductor-cooled voltage regulator module 100 is mounted tends to be hot, as heat generated by the processor 404 easily couples into the power delivery network. As a result, a majority of heat generated by the inductor-cooled voltage regulator module 100 should flow to the overlying heat sink 406 to exit the inductor-cooled voltage regulator module 100. Inductor cooled modules have lower thermal impedance to the bottom of the module package 100 given the location of the power devices, however this is not a preferred heat flow path for the reasons explained above. By providing a second (parallel) thermal path 'th2' via the part 134 of the metallic clip 128 attached to the second pad 112 of the power stage package 102, thermal coupling of the power stage package 102 to the topside of the module 100 is greatly increased which enables the system heat sink 138 to remove more heat generated by the power stage package 102 through the top of the inductor-cooled voltage regulator module 100.

Figure 5:
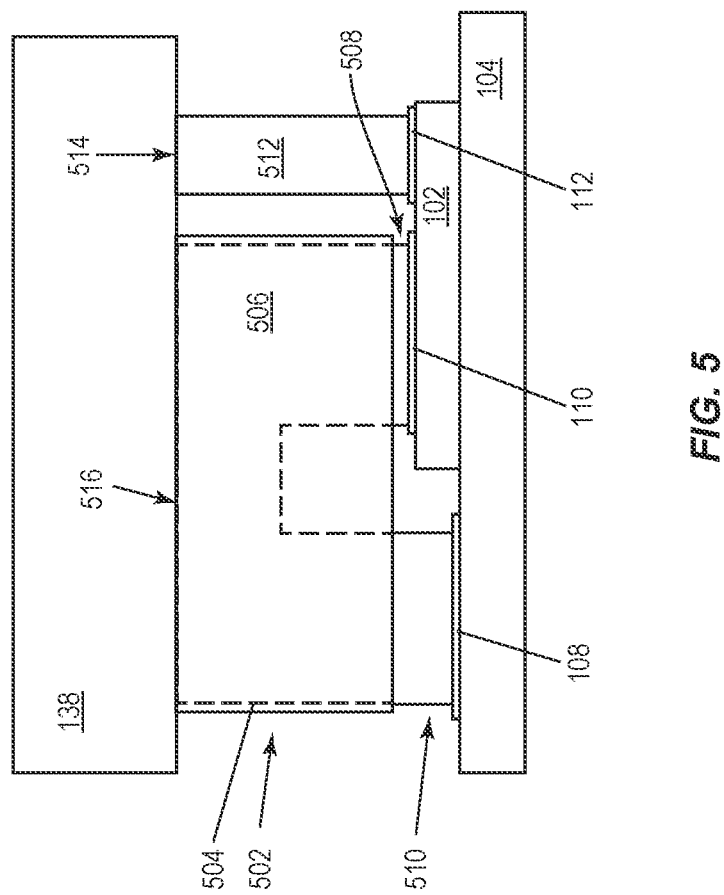
FIG. 5 illustrates a side perspective view of another embodiment of a voltage regulator module.

FIG. 5 illustrates a side perspective view of another embodiment of a voltage regulator module 500. The embodiment of the voltage regulator module 500 shown in FIG. 5 is similar to the embodiment of the inductor-cooled voltage regulator module 100 shown in FIGS. 1A through 1C. However, in FIG. 5, a discrete inductor 502 electrically connects the first pad 110 of the power stage package 102 to the power output terminal 108 of the substrate 104. The winding 504 of the discrete inductor 502 in FIG. 5 has a different shape/configuration compared to the vertical conductor 118 of the inductor 116 shown in FIGS. 1A through 1C. Each part of the winding 504 that is covered by a magnetic core 506 of the discrete inductor 502 is out of view in FIG. 5 and therefore shown in dashed lines.

Like the vertical conductor 118 of the inductor 116 shown in FIGS. 1A through 1C, the winding 504 of the discrete inductor 502 in FIG. 5 has a first end 508 that is attached to the first pad 110 of the power stage package 102, e.g., by a fixing material (not shown in FIG. 5) such as solder, an electrically conductive adhesive, etc. Different than the vertical conductor 118 of the inductor 116 shown in FIGS.

1A through 1C, the second end 510 of the winding 504 of the discrete inductor 502 in FIG. 5 is attached to the power output terminal 108 of the substrate 104, e.g., by a fixing material (not shown in FIG. 5) such as solder, an electrically conductive adhesive, etc. Accordingly, the metallic clip 128 shown in FIGS. 1A through 1C is omitted from the voltage regulator module 500 shown in FIG. 5.

To provide a thermal path to the second pad 112 of the power stage package 102, the voltage regulator module 500 shown in FIG. 5 further includes a metallic body 512 in thermal contact with the second pad 112 of the power stage package 102. As explained herein, the second pad 112 of the power stage package 102 may or may not be at an output voltage potential VOUT of the voltage regulator module 500 but does not carry any of the phase current. The phase current is instead carried by the first pad 110 of the power stage package 102. The metallic body 512 in thermal contact with the second pad 112 of the power stage package 102 may be a block, clip, spacer, etc., made of Cu (copper) or any other metal or metal alloy.

The voltage regulator module 500 shown in FIG. 5 may further include a heat sink 138 in thermal contact with the metallic body 512 at a side 514 of the metallic body 512 that faces away from the power stage package 102. The metallic body 512 provides a thermal path from the power stage package 102 to the heat sink 138. In FIG. 5, the top side 516 of the (e.g., copper) winding 504 is exposed and in thermal contact with the heat sink 138 at a side of the winding 504 that faces away from the power stage package 102. The exposed part 516 of the winding 504 provides an additional thermal path from the power stage package 102 to the heat sink 138.

Figure 6:
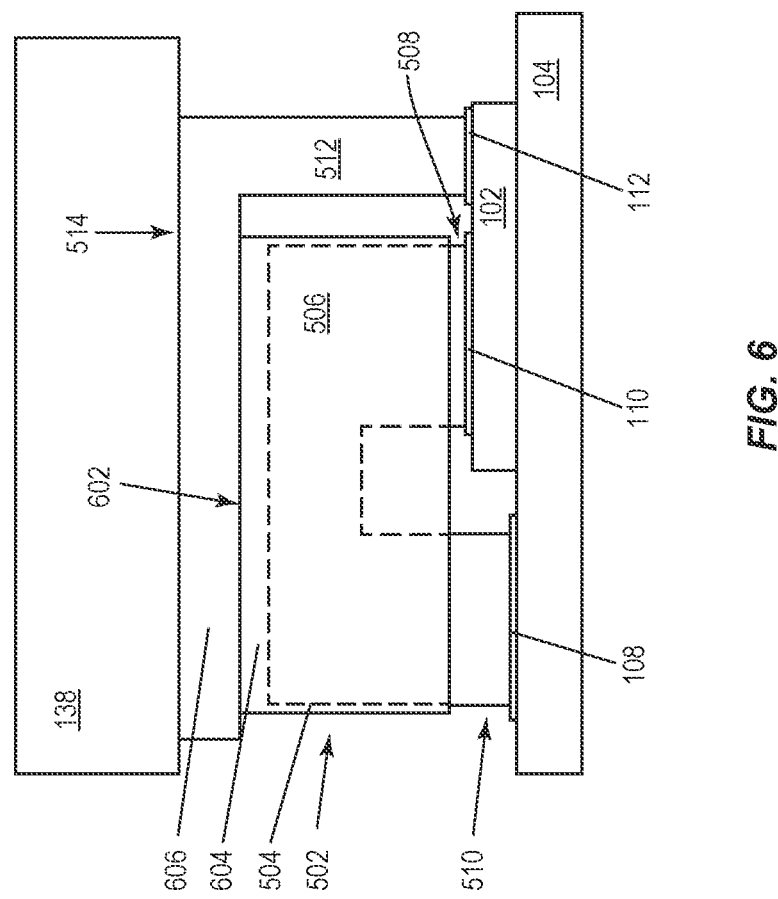
FIG. 6 illustrates a side perspective view of another embodiment of a voltage regulator module.

FIG. 6 illustrates a side perspective view of another embodiment of a voltage regulator module 600. The embodiment of the voltage regulator module 600 shown in FIG. 6 is similar to the embodiment of the voltage regulator module 500 shown in FIG. 5. However, in FIG. 6, the winding 504 of the discrete inductor 502 is covered by the magnetic core 506 at the topside 602 of the discrete inductor 502. As such, the inductor winding 504 is vertically spaced apart from the heat sink 138 by a region 604 of the magnetic core 506. According to this embodiment, the metallic body 512 includes a region 606 that covers the side 602 of the discrete inductor 502 that faces away from the power stage package 102, to increase a thermal contact area between the metallic body 512 and the heat sink 138.

The voltage regulator modules 500, 600 shown in FIGS. 5 and 6 may be produced by mounting the power stage package 102 to the module substrate 104 and thermally contacting the second pad 112 of the power stage package 102 with the metallic body 512. The voltage regulator module 500 shown in FIG. 5 and/or the voltage regulator module 600 shown in FIG. 6 may be used in place of or in addition to the inductor-cooled voltage regulator module 100 included in the electronic assembly 400 shown in the FIG. 4. Accordingly, the voltage regulator module 500 shown in FIG. 5 and/or the voltage regulator module 600 shown in FIG. 6 may be mounted to the system circuit board 402 of the electronic assembly 400 and provide power to one or more of the processors 404.

For the inductor-cooled voltage regulator module 100 shown in FIGS. 1A through 1C, the second pad 112 of the power stage package 102 may be electrically connected to a sense terminal of a semiconductor die embedded in the power stage package 102, to enable sensing of the module output voltage VOUT at the second pad 112 of the power stage package 102. For example, the gate driver die 300 shown in FIG. 3 may have a sense terminal 'SEN' designed for sensing the output voltage VOUT of the inductor-cooled voltage regulator module 100 and the package circuit board 146 may include one or more electrical conductors and/or vias that electrically connect the second pad 112 of the power stage package 102 to the sense terminal 'SEN' of the gate driver die 300. If the second pad 112 of the power stage package 102 is at the output voltage potential VOUT of the inductor-cooled voltage regulator module 100, the sense terminal of the gate driver die 300 may be electrically connected to the second pad 112 of the power stage package 102 to enable sensing of the module output voltage VOUT since the second pad 112 does not carry any of the phase current.

Figure 7:
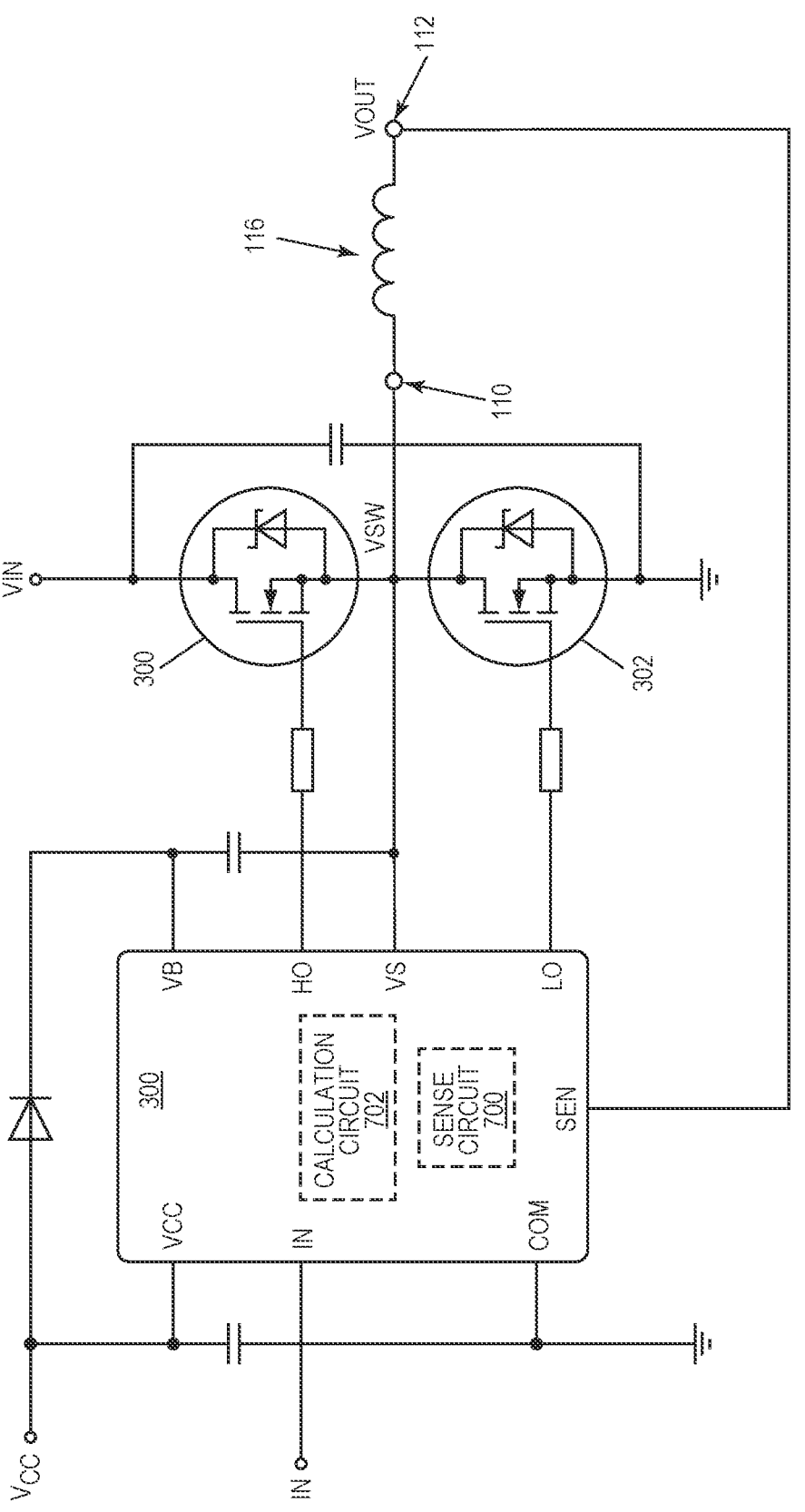
FIG. 7 illustrates a schematic diagram of an embodiment of a gate driver die included in the power stage package of the inductor-cooled voltage regulator module shown in FIGS. 1A through 1C.

FIG. 7 illustrates a schematic diagram of an embodiment of the gate driver die 300 with the sense terminal 'SEN' electrically connected to the second pad 112 of the power stage package 102, to enable sensing of the module output voltage VOUT. The gate driver die 300 may have a low-side supply voltage terminal 'VCC', a ground terminal 'COM', a logic input signal terminal 'IN', a floating well supply voltage terminal 'VB', a floating well supply return voltage terminal 'VS', a high-side floating gate drive terminal 'HO' for driving the gate of the first power switch die 302, a low-side floating gate drive terminal 'LO' for driving the gate of the second power switch die 304, etc.

A sense circuit 700 included in the gate driver die 300 senses the output voltage potential VOUT of the inductor-cooled voltage regulator module 100 at the sense terminal 'SEN'. A calculation circuit 702 included in the gate driver die 300 calculates an inductance L for the inductor 116 based on the output voltage potential VOUT sensed by the sense circuit 700 at the sense terminal 'SEN'. Such output voltage information may be routed to dedicated circuitry within the power stage package 102 to implement control functionalities and/or compute electrical parameters.

For example, the calculation circuit 702 may perform the inductance calculation using the following equation:

$$V = L\frac{di}{dt} \qquad (1)$$

where V is the voltage applied to the inductor 116, L is the inductance and di/dt is the current change rate over time. In a buck converter, equation (1) may be translated as follows:

$$L = (V_{sw} - V_{out}) * \frac{DT_{sw}}{I_{pkpk}} \qquad (2)$$

Or $$L = (V_{out}) * \frac{(1 - D)T_{sw}}{I_{pkpk}} \qquad (3)$$

Where $V_{sw}$ is the switch-node voltage, D is the duty cycle, $T_{sw}$ is the switching period $I_{pkpk}$ is the inductor current ripple, and $V_{out}$ is the module output voltage. All information except $V_{out}$ are typically available. Accordingly, bringing the module output voltage information VOUT to the second pad 112 of the power stage package 102 enables a more accurate inductance computation as described above.

The calculation circuit 702 may dynamically and continuously compute the inductance L, yielding several benefits to the overall system, particularly in applications where the magnetic material employed (e.g., belonging to a class of soft-saturating materials) is such that the inductance L drops with increasing DC load current. For example, the inductance information may be fed to the controller (not shown), to dynamically tune an over current protection threshold according to the loading condition or, in general, for dynamic tuning of the controller parameters.

More generally, whether the second pad 112 of the power stage package 102 is used to sense the module output voltage VOUT, no phase current flows through the second pad 112 nor into the part 134 of the metallic clip 128 attached to the second pad 112. Accordingly, the part 134 of the metallic clip 128 attached to the second pad 112 of the power stage package 102 is very effective at sinking heat out as no conduction losses occur along this part 134 of the metallic clip 128 and therefore no additional heat is dissipated.

Figure 8:
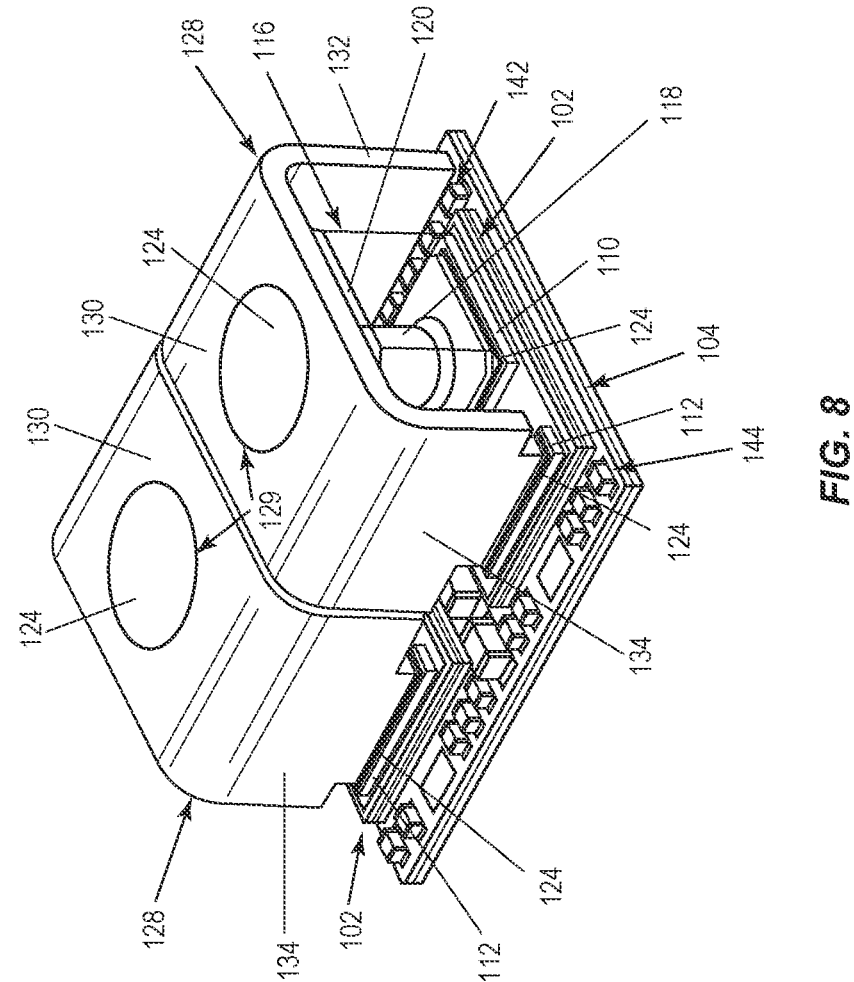
FIG. 8 illustrates a top perspective view of another embodiment of an inductor-cooled voltage regulator module.

FIG. 8 illustrates a top perspective view of another embodiment of an inductor-cooled voltage regulator module 800. The embodiment of the inductor-cooled voltage regulator module 800 shown in FIG. 8 is similar to the embodiment of the inductor-cooled voltage regulator module 100 shown in FIGS. 1A through 1C. However, in FIG. 8, the inductor-cooled voltage regulator module 800 has a split clip design for the independent phases. According to this embodiment, the inductor-cooled voltage regulator module 800 in FIG. 8 has a discrete (separate) metallic clip 128 for each inductor 116 such that the phases of the voltage regulator module 800 are independent of one another.

Although the present disclosure is not so limited, the following numbered examples demonstrate one or more aspects of the disclosure.

Example 1. A voltage regulator module, comprising: a substrate having a power input terminal and a power output terminal; a power stage package mounted to the substrate and having a first pad and a second pad at a side that faces away from the substrate, the power stage package configured to receive an input voltage from the power input terminal and output a phase current at the first pad; an inductor having a vertical conductor embedded in a magnetic core, the vertical conductor having a first end attached to the first pad of the power stage package and a second end opposite the first end; and a metallic clip attached to each of the second end of the vertical conductor, the power output terminal of the substrate, and the second pad of the power stage package, wherein the second pad of the power stage package but does not carry any of the phase current.

Example 2. The voltage regulator module of example 1, wherein the second pad of the power stage package is electrically connected to a sense terminal of a semiconductor die embedded in the power stage package.

Example 3. The voltage regulator module of example 2, wherein the second pad of the power stage package is at an output voltage potential of the voltage regulator module, and wherein a sense circuit included in the semiconductor die is configured to sense the output voltage potential of the voltage regulator module at the sense terminal.

Example 4. The voltage regulator module of example 3, wherein a calculation circuit included in the semiconductor die is configured to calculate an inductance for the inductor based on the output voltage potential sensed by the sense circuit at the sense terminal.

Example 5. The voltage regulator module of any of examples 1 through 4, wherein the second pad of the power stage package is divided into a plurality of spaced apart segments.

Example 6. The voltage regulator module of any of examples 1 through 5, wherein a first power switch die, a second power switch die, and a gate driver die are embedded in the power stage package, wherein the first power switch die and the second power switch die are electrically connected in series and configured to deliver the phase current to the first pad of the power stage package, and wherein the gate driver die is configured to drive both the first power switch die and the second power switch die.

Example 7. The voltage regulator module of any of examples 1 through 6, wherein the metallic clip comprises: a first part attached to the second end of the vertical conductor; a second part that electrically connects the power output terminal of the substrate to the first part of the metallic clip; and a third part that thermally connects the second pad of the power stage package to the first part of the metallic clip.

Example 8. The voltage regulator module of example 7, further comprising: a heat sink in thermal contact with the metallic clip at a side of the metallic clip that faces away from the power stage package, wherein the third part and the first part of the metallic clip provide a first thermal path from the power stage package to the heat sink, wherein the vertical conductor of the inductor and the first part of the metallic clip provide a second thermal path from the power stage package to the heat sink.

Example 9. An electronic assembly, comprising: a circuit board; a processor mounted to the circuit board; and the voltage regulator module of example 1, wherein the voltage regulator module is mounted to the circuit board and configured to provide power to the processor.

Example 10. The electronic assembly of example 9, further comprising: a heat sink in thermal contact with both the metallic clip of the voltage regulator module and a socket or interposer that mounts the processor to the circuit board.

Example 11. A voltage regulator module, comprising: a substrate having a power input terminal and a power output terminal; a power stage package mounted to the substrate and having a first pad and a second pad at a side that faces away from the substrate, the power stage package configured to receive an input voltage from the power input terminal and output a phase current at the first pad; a discrete inductor electrically connecting the first pad of the power stage package to the power output terminal of the substrate; and a metallic body in thermal contact with the second pad of the power stage package, wherein the second pad of the power stage package does not carry any of the phase current.

Example 12. The voltage regulator module of example 11, further comprising: a heat sink in thermal contact with the metallic body at a side of the metallic body that faces away from the power stage package, wherein the metallic body provides a first thermal path from the power stage package to the heat sink.

Example 13. The voltage regulator module of example 12, wherein the discrete inductor has an exposed copper winding that is in thermal contact with the heat sink at a side of the exposed copper winding that faces away from the power stage package, and wherein the exposed copper winding provides a second thermal path from the power stage package to the heat sink.

Example 14. The voltage regulator module of example 12, wherein the metallic body covers a side of the discrete inductor that faces away from the power stage package to increase a thermal contact area between the metallic body and the heat sink.

Example 15. The voltage regulator module of any of examples 11 through 14, wherein a first power switch die, a second power switch die, and a gate driver die are embedded in the power stage package, wherein the first power switch die and the second power switch die are electrically connected in series and configured to deliver the phase current to the first pad of the power stage package, and wherein the gate driver die is configured to drive both the first power switch die and the second power switch die.

Example 16. An electronic assembly, comprising: a circuit board; a processor mounted to the circuit board; and the voltage regulator module of example 11, wherein the voltage regulator module is mounted to the circuit board and configured to provide power to the processor.

Example 17. The electronic assembly of example 16, further comprising: a heat sink in thermal contact with both the metallic body of the voltage regulator module and a socket or interposer that mounts the processor to the circuit board.

Example 18. A method of producing a voltage regulator module, the method comprising: mounting a power stage package to a substrate, the substrate having a power input terminal and a power output terminal, the power stage package having a first pad and a second pad at a side that faces away from the substrate, the power stage package configured to receive an input voltage from the power input terminal and output a phase current at the first pad; attaching a first end of a vertical conductor of an inductor to the first pad of the power stage package, the vertical conductor being embedded in a magnetic core and having a second end opposite the first end; and attaching a metallic clip to each of the second end of the vertical conductor, the power output terminal of the substrate, and the second pad of the power stage package, wherein the second pad of the power stage package but does not carry any of the phase current.

Example 19. A method of producing a voltage regulator module, the method comprising: mounting a power stage package to a substrate, the substrate having a power input terminal and a power output terminal, the power stage package having a first pad and a second pad at a side that faces away from the substrate, the power stage package configured to receive an input voltage from the power input terminal and output a phase current at the first pad; electrically connecting the first pad of the power stage package to the power output terminal of the substrate via a discrete inductor; and thermally contacting the second pad of the power stage package with a metallic body, wherein the second pad of the power stage package but does not carry any of the phase current.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage regulator module, comprising:
a substrate having a power input terminal and a power output terminal;
a power stage package mounted to the substrate and having a first pad and a second pad at a side that faces away from the substrate, the power stage package configured to receive an input voltage from the power input terminal and output a phase current at the first pad;
an inductor having a vertical conductor embedded in a magnetic core, the vertical conductor having a first end attached to the first pad of the power stage package and a second end opposite the first end; and
a metallic clip attached to each of the second end of the vertical conductor, the power output terminal of the substrate, and the second pad of the power stage package,
wherein the second pad of the power stage package does not carry any of the phase current.

2. The voltage regulator module of claim 1, wherein the second pad of the power stage package is electrically connected to a sense terminal of a semiconductor die embedded in the power stage package.

3. The voltage regulator module of claim 2, wherein the second pad of the power stage package is at an output voltage potential of the voltage regulator module, and wherein a sense circuit included in the semiconductor die is configured to sense the output voltage potential of the voltage regulator module at the sense terminal.

4. The voltage regulator module of claim 3, wherein a calculation circuit included in the semiconductor die is configured to calculate an inductance for the inductor based on the output voltage potential sensed by the sense circuit at the sense terminal.

5. The voltage regulator module of claim 1, wherein the second pad of the power stage package is divided into a plurality of spaced apart segments.

6. The voltage regulator module of claim 1, wherein a first power switch die, a second power switch die, and a gate driver die are embedded in the power stage package, wherein the first power switch die and the second power switch die are electrically connected in series and configured to deliver the phase current to the first pad of the power stage package, and wherein the gate driver die is configured to drive both the first power switch die and the second power switch die.

7. The voltage regulator module of claim 1, wherein the metallic clip comprises:
a first part attached to the second end of the vertical conductor;
a second part that electrically connects the power output terminal of the substrate to the first part of the metallic clip; and
a third part that thermally connects the second pad of the power stage package to the first part of the metallic clip.

8. The voltage regulator module of claim 7, further comprising:
a heat sink in thermal contact with the metallic clip at a side of the metallic clip that faces away from the power stage package,
wherein the third part and the first part of the metallic clip provide a first thermal path from the power stage package to the heat sink,
wherein the vertical conductor of the inductor and the first part of the metallic clip provide a second thermal path from the power stage package to the heat sink.

9. An electronic assembly, comprising:
a circuit board;
a processor mounted to the circuit board; and
the voltage regulator module of claim 1,
wherein the voltage regulator module is mounted to the circuit board and configured to provide power to the processor.

10. The electronic assembly of claim 9, further comprising:
a heat sink in thermal contact with both the metallic clip of the voltage regulator module and a socket or interposer that mounts the processor to the circuit board.

11. A voltage regulator module, comprising:
a substrate having a power input terminal and a power output terminal;
a power stage package mounted to the substrate and having a first pad and a second pad at a side that faces away from the substrate, the power stage package configured to receive an input voltage from the power input terminal and output a phase current at the first pad;
a discrete inductor electrically connecting the first pad of the power stage package to the power output terminal of the substrate; and
a metallic body in thermal contact with the second pad of the power stage package,
wherein the second pad of the power stage package does not carry any of the phase current.

12. The voltage regulator module of claim 11, further comprising:
a heat sink in thermal contact with the metallic body at a side of the metallic body that faces away from the power stage package,
wherein the metallic body provides a first thermal path from the power stage package to the heat sink.

13. The voltage regulator module of claim 12, wherein the discrete inductor has an exposed copper winding that is in thermal contact with the heat sink at a side of the exposed copper winding that faces away from the power stage package, and wherein the exposed copper winding provides a second thermal path from the power stage package to the heat sink.

14. The voltage regulator module of claim 12, wherein the metallic body covers a side of the discrete inductor that faces away from the power stage package to increase a thermal contact area between the metallic body and the heat sink.

15. The voltage regulator module of claim 11, wherein a first power switch die, a second power switch die, and a gate driver die are embedded in the power stage package, wherein the first power switch die and the second power switch die are electrically connected in series and configured to deliver the phase current to the first pad of the power stage package, and wherein the gate driver die is configured to drive both the first power switch die and the second power switch die.

16. An electronic assembly, comprising:

a circuit board;

a processor mounted to the circuit board; and the voltage regulator module of claim 11, wherein the voltage regulator module is mounted to the circuit board and configured to provide power to the processor.

17. The electronic assembly of claim 16, further comprising:

a heat sink in thermal contact with both the metallic body of the voltage regulator module and a socket or interposer that mounts the processor to the circuit board.

18. A method of producing a voltage regulator module, the method comprising:

mounting a power stage package to a substrate, the substrate having a power input terminal and a power output terminal, the power stage package having a first pad and a second pad at a side that faces away from the substrate, the power stage package configured to receive an input voltage from the power input terminal and output a phase current at the first pad;

attaching a first end of a vertical conductor of an inductor to the first pad of the power stage package, the vertical conductor being embedded in a magnetic core and having a second end opposite the first end; and attaching a metallic clip to each of the second end of the vertical conductor, the power output terminal of the substrate, and the second pad of the power stage package, wherein the second pad of the power stage package does not carry any of the phase current.

19. A method of producing a voltage regulator module, the method comprising:

mounting a power stage package to a substrate, the substrate having a power input terminal and a power output terminal, the power stage package having a first pad and a second pad at a side that faces away from the substrate, the power stage package configured to receive an input voltage from the power input terminal and output a phase current at the first pad;

electrically connecting the first pad of the power stage package to the power output terminal of the substrate via a discrete inductor; and thermally contacting the second pad of the power stage package with a metallic body, wherein the second pad of the power stage package does not carry any of the phase current.

\* \* \* \* \*